United States Patent
Brady et al.

(12) 
(10) Patent No.: US 6,518,885 B1
(45) Date of Patent: Feb. 11, 2003

(54) ULTRA-THIN OUTLINE PACKAGE FOR INTEGRATED CIRCUIT

(75) Inventors: Michael John Brady, Brewster, NY (US); Venkata S. R. Kodukula, Yorktown Heights, NY (US)

(73) Assignee: Intermec IP Corp., Woodland Hills, CA (US)

( * ) Notice: Subject to any disclaimer, the term of this patent is extended or adjusted under 35 U.S.C. 154(b) by 0 days.

(21) Appl. No.: 09/417,635

(22) Filed: Oct. 14, 1999

(51) Int. Cl.$^7$ .............................................. G08B 13/14
(52) U.S. Cl. ................. 340/572.7; 340/572.8; 257/698; 257/774
(58) Field of Search .......................... 340/572.7, 572.8, 340/572.1; 257/698, 773, 774, 784, 787

(56) References Cited

U.S. PATENT DOCUMENTS

| | | | |
|---|---|---|---|
| 6,013,948 A | * 1/2000 | Akram et al. | 257/680 |
| 6,100,804 A | * 8/2000 | Brady et al. | 257/678 |
| 6,215,401 B1 | * 4/2001 | Brady et al. | 340/568.1 |
| 6,246,327 B1 | * 6/2001 | Eberhardt | 257/758 |
| 6,262,692 B1 | * 7/2001 | Babb | 343/895 |
| 6,329,213 B1 | * 12/2001 | Tuttle et al. | 29/846 |

* cited by examiner

*Primary Examiner*—Daniel J. Wu
*Assistant Examiner*—Sihong Huang
(74) *Attorney, Agent, or Firm*—O'Melveny & Myers LLP

(57) ABSTRACT

The present invention is directed to an ultra-thin outline package for integrated circuits that is much smaller than conventional chip packaging structures. The ultra-thin outline package is particularly useful in fabricating RF or RFID transponders. In an embodiment of the invention, the ultra-thin outline package includes a substrate having an aperture. At least one conductive trace that includes upper and lower portions is disposed on respective upper and lower surfaces of the substrate. The substrate further comprises at least one via electrically connecting the conductive trace portions together. An integrated circuit is disposed in the aperture and is operatively coupled to the upper portion of the conductive trace. An encapsulant is provided in the aperture substantially covering the integrated circuit. The lower portion of the conductive trace is adapted for coupling of the ultra-thin outline package to a secondary substrate using conventional surface mounting techniques. The via connecting the upper and lower trace portions may be disposed either on at least one edge surface of the aperture or on at least one edge surface of the substrate. At least one wire bond electrically couples the integrated circuit to the conductive trace, and the encapsulant covers the integrated circuit and the wire bond. Using printed circuit board material for the substrate, the ultra-thin outline package achieves a vertical profile of approximately 0.3 to 0.375 mm (12 to 15 mils).

32 Claims, 3 Drawing Sheets

ULTRA-THIN OUTLINE PACKAGE FOR INTEGRATED CIRCUIT

BACKGROUND OF THE INVENTION

1. Field of the Invention

The present invention relates generally to integrated circuits, and more particularly, to a method and system for packaging integrated circuits to provide an ultra-thin outline package.

2. Description of Related Art

In the semiconductor packaging industry, it is known to assemble a semiconductor chip into a plastic package having a lead frame that provides electrical connections to the chip through the package material. These chip packages may be connected to a printed circuit board using various techniques, such as surface mounting. A surface mounted package has leads configured to lie flat on top of conductive pads provided on the printed circuit board. The leads are then soldered to the conductive pads. A conductive solder paste may be used to temporarily hold the chip package in place while the printed circuit board and chip are placed into an oven. The heat from the oven then causes the solder paste to flow and form an electrical connection between the leads and pads upon subsequent cooling of the solder paste.

It is increasingly desirable to reduce the profile of the semiconductor package above the printed circuit board so that electronic systems can be incorporated into compact devices and products. Various low-profile format semiconductor packages have been developed, such as thin small outline package (TSOP), thin shrink small outline package (TSSOP), and mini small outline package (MSOP). The smallest of these package formats, MSOP, has a profile of one millimeter. A drawback of these low profile package formats is they are not conducive to rapid prototyping of chip designs where the footprint or size of the semiconductor chip changes and does not fit an existing leadframe. With each new semiconductor chip design, an associated lead frame and injection mold for the plastic package must be adapted specifically.

It is also known to attach semiconductor chips to a circuit board or substrate directly without using a plastic package or lead frame. Instead, the chip is bonded directly to the surface of the substrate and wire bonds are used to join conductive pads of the chip to corresponding conductive traces of the substrate. Alternatively, the chip can be flipped upside down ("flip-chip") and the conductive pads of the chip directly aligned to the conductive pads of the substrate. Thereafter, the chip may be encapsulated in an epoxy resin ("glob-top") to provide environmental protection of the chip and electrical connections. While these methods are desirable in reducing the profile of the chip above the substrate, they have significant drawbacks as well. The wire bonds require a minimum vertical (i.e., relative to the plane of the chip) loop height that translates into increased profile of the chip. A drawback of flip-chip attachment is the difficulty of aligning the chip to the conductive traces of the substrate, and high precision optical alignment systems are generally necessary to achieve proper alignment.

One application for low-profile chip packaging is in the fabrication of radio frequency (RF) and radio frequency identification (RFID) transponders. The use of RF transponders (also known as RF tags) has grown in prominence as a way to track data regarding an object on which an RF transponder is affixed. An RF transponder may comprise a semiconductor chip and an antenna mounted to a substrate. An RF interrogator containing a transmitter-receiver unit is used to query an RF transponder that may be at a distance from the interrogator. The RF transponder detects the interrogating signal and transmits a response signal containing encoded data back to the interrogator. RF transponders may either be "battery-powered," in which they include an internal power source (i.e., battery), or "field-powered," in which they do not include a battery and derive their energy entirely from the interrogating signal provided by the RF interrogator. The battery powered RF transponders generally have a greater operating range than field powered transponders, but have the associated disadvantage of greater bulk due to the inclusion of the battery. An RFID transponder further includes a semiconductor memory that can store identifying information regarding an object to which the RFID transponder is affixed. RF and RFID systems are used in numerous applications, such as inventory management, security access, personnel identification, factory automation, automotive toll debiting, and vehicle identification, to name just a few. Since it is desirable to include RF and RFID systems in compact applications, such as in a printed label or card stock, there is a critical need for very low-profile packaging for the semiconductor chip.

Accordingly, it would be very desirable to provide a chip packaging method and apparatus having a profile less than the aforementioned packaging and chip attachment techniques. More specifically, it would be very desirable to provide a very low-profile chip packaging method for use in fabricating RF or RFID transponders.

SUMMARY OF THE INVENTION

The present invention is directed to an ultra-thin outline package for integrated circuits that is much smaller than conventional chip packaging structures. The ultra-thin outline package is particularly useful in fabricating RF or RFID transponders.

In an embodiment of the invention, the ultra-thin outline package includes a substrate having an aperture. At least one conductive trace that includes upper and lower portions is disposed on respective upper and lower surfaces of the substrate. The substrate further comprises at least one via electrically connecting the conductive trace portions together. An integrated circuit is disposed in the aperture and is operatively coupled to the upper portion of the conductive trace. An encapsulant is provided in the aperture substantially covering the integrated circuit. The lower portion of the conductive trace is adapted for coupling of the ultra-thin outline package to a secondary substrate using conventional surface mounting techniques. The via connecting the upper and lower trace portions may be disposed either on at least one edge surface of the aperture or on at least one edge surface of the substrate. At least one wire bond electrically couples the integrated circuit to the conductive trace, and the encapsulant covers the integrated circuit and the wire bond. Using printed circuit board material for the substrate, the ultra-thin outline package achieves a vertical profile of approximately 0.3 to 0.375 mm (or 12 to 15 mils).

An alternative embodiment of the ultra-thin outline package comprises a substrate having at least one hole extending therethrough. At least one conductive trace is disposed on a lower surface of the substrate at least partially blocking the hole. An integrated circuit is disposed on the substrate and is operatively coupled to the conductive trace through the hole. An encapsulant substantially covers the integrated circuit. The conductive trace is adapted for coupling of the ultra-thin outline package to a secondary substrate using conventional surface mounting techniques. At least one wire bond electrically connects the integrated circuit to the conductive trace, and the encapsulant covers the integrated circuit and the wire bond.

The ultra-thin outline package may be used to fabricate a radio frequency (RF) transponder. The transponder includes a secondary substrate having an antenna disposed on a surface thereof. The ultra-thin outline package may be surface mounted on the secondary substrate in electrical connection with said antenna.

A more complete understanding of the ultra-thin outline package for integrated circuits will be afforded to those skilled in the art, as well as a realization of additional advantages and objects thereof, by a consideration of the following detailed description of the preferred embodiment. Reference will be made to the appended sheets of drawings that will first be described briefly.

DETAILED DESCRIPTION OF THE PREFERRED EMBODIMENT

The present invention satisfies the critical need for a chip packaging method and apparatus having a very low-profile chip packaging method for use in fabricating RF or RFID transponders. In the detailed description that follows, like element numerals are used to describe like elements illustrated in one or more of the aforementioned figures.

Figure 1:
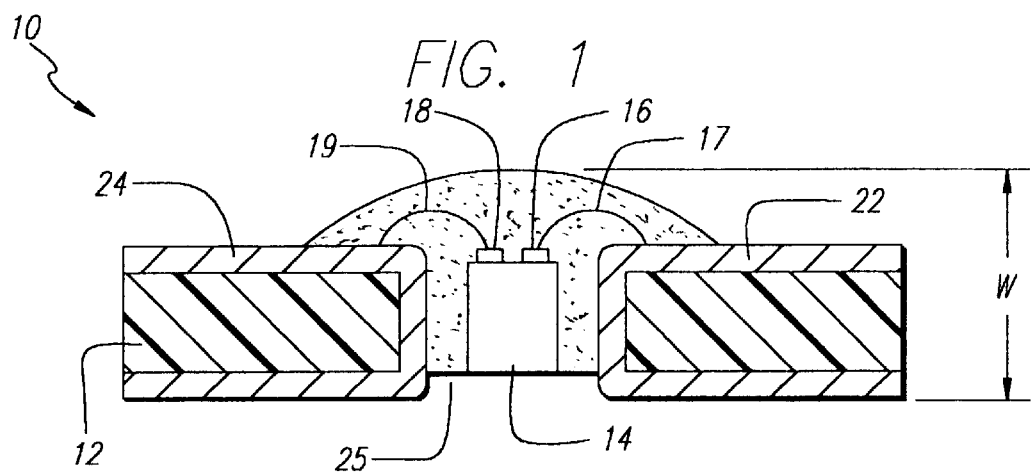
FIG. 1 is a cross-sectional side view of an ultra-thin outline package (UTOP) constructed in accordance with a first embodiment of the present invention.
Figure 2:
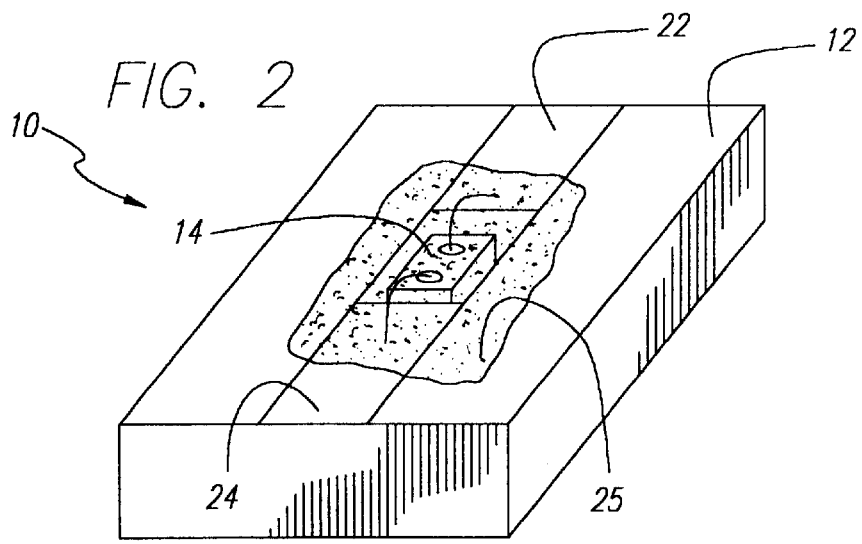
FIG. 2 is an isometric view of the UTOP of FIG. 1.

Referring first to FIGS. 1 and 2, an ultra-thin outline package (UTOP) 10 is illustrated in accordance with a first embodiment of the present invention. The UTOP 10 includes a substrate 12 comprised of a double-sided circuit board material, such as a glass/cloth-based epoxy resin copper-clad laminate or FR-4. Alternatively, the substrate material can include tetrafunctional epoxy, multifunctional epoxy, high performance epoxy, BT/epoxy, or organic materials such as polyester, polyimide, and the like. The substrate 12 has an aperture defined in a central portion thereof. The aperture is shown in FIG. 2 as being generally rectangular in shape, though it should be appreciated that other shapes could also be advantageously utilized. Drilling or milling away excess material, or other conventional stamping or material forming methods may form the aperture. The substrate 12 is laminated on both the upper and lower surfaces thereof using a material having sufficiently high electrical conductivity, such as a metallic material comprising copper (Cu) or aluminum (Al). The aperture is plated with conductive material to form a via providing electrical connection between the upper and lower surface laminations. Thereafter, the upper and lower surface laminations and the aperture are patterned to provide continuous electrical traces 22, 24, such as utilizing a photolithographic, ion etching, chemical etching, or vapor deposition process. The electrical traces 22, 24 each comprise a conductive path that extends across a portion of the upper surface of the substrate 12, down through the aperture on a single surface thereof, then across a portion of the lower surface of the substrate. In this manner, the electrical traces 22, 24 are electrically isolated from one another. The electrical traces 22, 24 may further be plated with electroless nickel/gold to protect the traces from oxidation and to allow wire bonding or soldering thereto.

An integrated circuit chip 14 is disposed in the aperture of the substrate 12. The integrated circuit chip 14 includes conductive pads 16, 18 that permit electrical connection to the chip. In the preferred embodiment of the invention, the integrated circuit chip 14 contains circuitry to provide RF or RFID transponder functionality, such as signal processing circuitry, memory, and control logic. The conductive pads 16, 18 are coupled to respective ones of the electrical traces 22, 24 using wire bonds 17, 19, respectively. Thereafter, the integrated circuit chip 14 and the wire bonds 17, 19 are encapsulated within the aperture by an encapsulating material 25 such as epoxy or other suitable material. The encapsulating material (sometimes referred to as "glob-top") is later cured into a hard protective coating that protects the integrated circuit chip 14 from environmental conditions such as humidity and moisture.

As shown in FIG. 1, the completed UTOP 10 has a profile thickness, w, measured from the lower surface of the substrate 12 to the top of the encapsulating material 25 of approximately 0.3 to 0.375 mm (12 to 15 mils). The thickness of the UTUP 10 is determined primarily by the thickness of the integrated circuit chip 14. Using conventional thinning techniques, the integrated circuit chip 14 can be reduced to a thickness of approximately 0.2 mm (8.5 mils). FR-4 circuit board material is available with the same thickness of approximately 0.2 mm (8.5 mils), so the integrated circuit chip 14 would fit substantially flush within an aperture formed in an FR-4 substrate. The wire bonds and glob-top add additional thickness to the UTOP 10. It is further anticipated that the thickness of the integrated circuit chip 14 could be further reduced to approximately 0.075 to 0.1 mm (3 to 4 mils) using plasma etching techniques. FR-4 circuit board material is available in thicknesses of 0.087 and 0.125 mm (3.5 and 5 mils). Accordingly, a UTOP 10 package having a profile thickness, w, of approximately 0.125 mm (5 mils) could be fabricated. No other packaging format for integrated circuits achieves such a small profile.

It should be appreciated that other types of integrated circuit chips having different numbers of conductive pads could also be advantageously utilized in accordance with the present invention. For example, an integrated circuit may be provided with only a single input/output (I/O) pad for coupling to a monopole antenna, as described in copending application Ser. No. 09/392,969, filed Sep. 9, 1999, which is incorporated by reference herein in its entirety. In such an integrated circuit, it would be appreciated that only a single conductive trace would be required.

Figure 3:
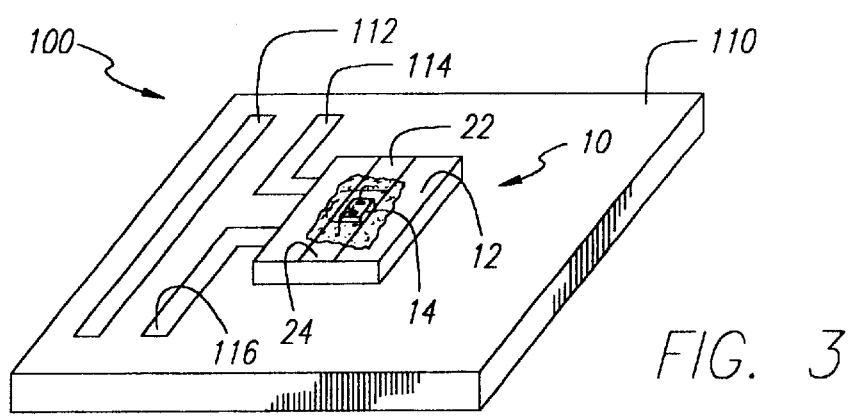
FIG. 3 is an isometric view of the UTOP of FIG. 1 affixed to a substrate layer to provide an RF transponder.

Referring now to FIG. 3, the UTOP 10 is used in the fabrication of an RF transponder 100. More particularly, the RF transponder 100 comprises a substrate 110 comprised of organic materials such as polyester, polyimide, and the like, or circuit board materials such as FR-4. An antenna is formed on the substrate 100 and comprises impedance tuning element 112 and antenna elements 114, 116. While the antenna illustrated in FIG. 3 may be recognized as being a dipole antenna, it should be appreciated that other known types of antenna may be provided on the substrate 110, such as a loop, meander or folded dipole, or patch. The antenna may be patterned from a laminate of conductive material, such as metallic material comprising copper (Cu) or aluminum (Al), such as utilizing a photolithographic, ion etching, or chemical etching process. The UTOP 10 is bonded to the substrate 110 and electrical connections formed between the antenna elements 114, 116 and the electrical traces 22, 24 disposed on the lower surface of the substrate 12 using conventional surface mounting techniques.

The UTOP package is advantageous over other conventional integrated circuit package forms, such as MSOP, due to its substantially reduced overall thickness in the vertical direction. This reduced thickness enables numerous compact applications for electronic systems such as RF and RFID transponders. For example, an RFID transponder fabricated in accordance with the embodiment of FIG. 3 described above could be inserted into a paper label stock that could be printed upon using conventional printing technology without risk of harm to the printhead in view of the minimal differential thickness of the label stock. The UTOP package could be assembled in numerous formats including strips, panels or reel-to-reel. Using a flexible organic substrate having a thickness of approximately 0.075 mm (3 mils) and a UTOP package having a thickness of approximately 0.125 mm (5 mils), the overall thickness of an RF transponder could be as little as 0.2 mm (8 mils). Since flexible substrates are available with thicknesses of 0.025 or 0.050 mm (1 or 2 mils), the overall thickness of an RF transponder could be further reduced.

Figure 4:
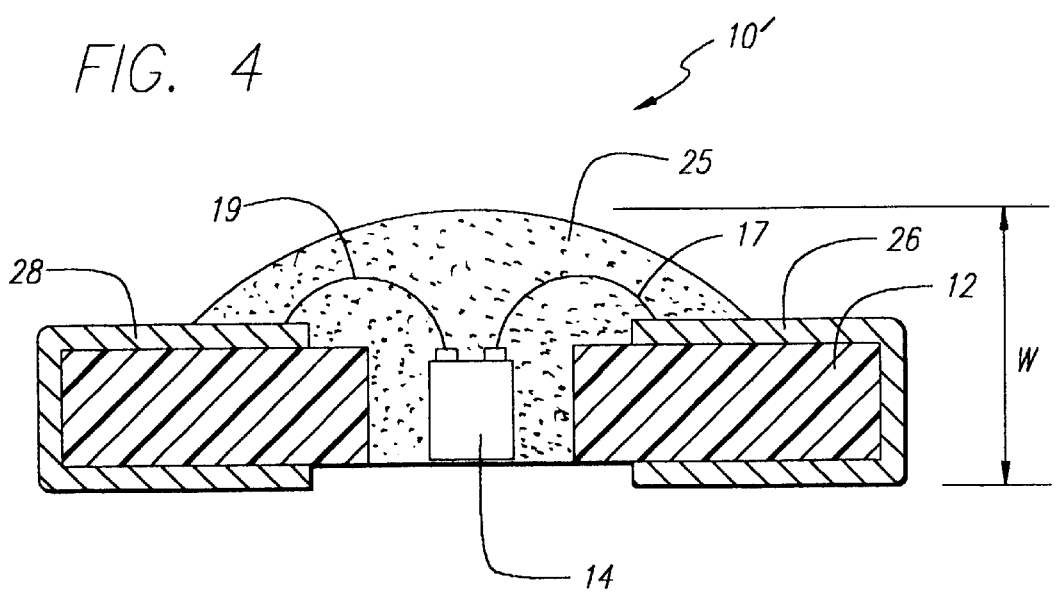
FIG. 4 is a cross-sectional side view of a UTOP constructed in accordance with a second embodiment of the present invention.
Figure 5:
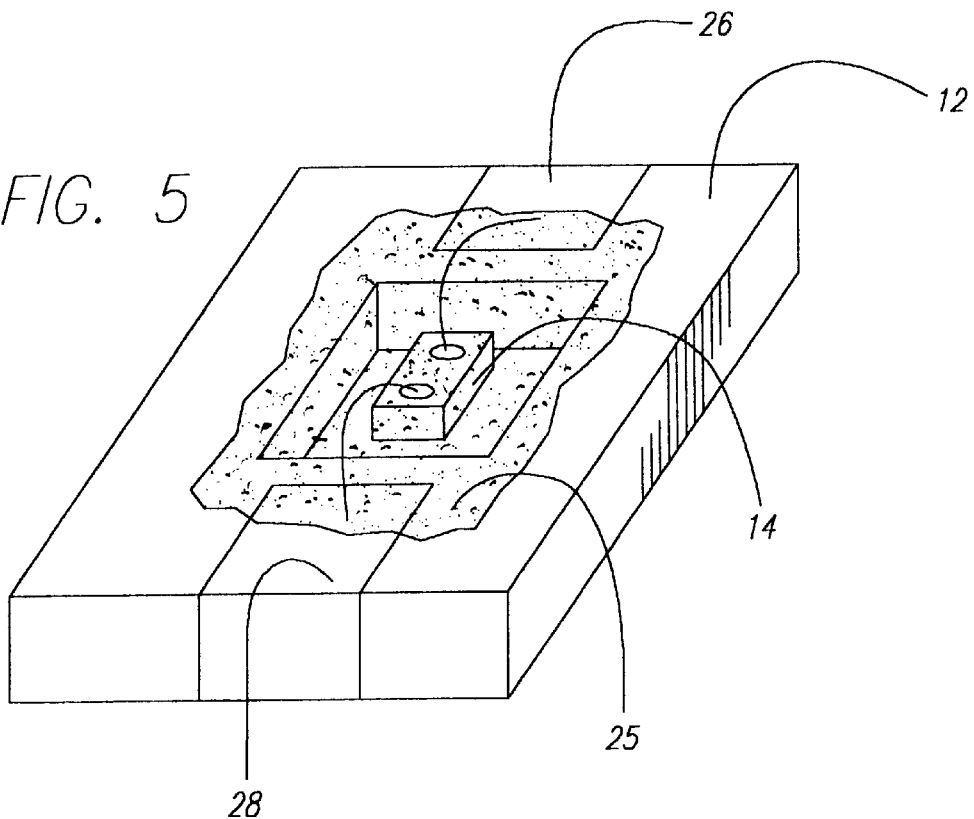
FIG. 5 is an isometric view of the UTOP of FIG. 4.

FIGS. 4 and 5 illustrate a UTOP package 10' constructed in accordance with a second embodiment of the present invention. As in the first embodiment, the UTOP 10' includes a substrate 12 comprised of a double-sided circuit board material, and has an aperture defined in a central portion thereof. The substrate 12 is laminated on both the upper and lower surfaces thereof using a material having sufficiently high electrical conductivity, such as a metallic material comprising copper (Cu) or aluminum (Al). Unlike the foregoing embodiment, interior surfaces of the aperture are not plated. Instead, outer edges of the substrate 12 are plated to provide a via so that the upper and lower surface laminations are in electrical communication together. Thereafter, the upper and lower surface laminations and the aperture are patterned to provide continuous electrical traces 26, 28, such as utilizing a photolithographic, ion etching, chemical etching, or vapor deposition process. The electrical traces 26, 28 each comprise a conductive path that extends across a portion of the upper surface of the substrate 12, down the outer edge of the substrate, then across a portion of the lower surface of the substrate. In this manner, the electrical traces 26, 28 are electrically isolated from one another. The electrical traces 26, 28 may further be plated with electroless nickel/gold to protect the traces from oxidation and to allow wire bonding or soldering thereto, as described above.

An integrated circuit chip 14 is disposed in the aperture of the substrate 12 in the same manner as described above. The integrated circuit chip 14 includes conductive pads 16, 18 that are coupled to respective ones of the electrical traces 26, 28 using wire bonds 17, 19, respectively. Thereafter, the integrated circuit chip 14 and the wire bonds 17, 19 are encapsulated within the aperture by an encapsulating material 25 such as epoxy. As in the first embodiment, the completed UTOP 10' has a profile, w, measured from the lower surface of the substrate 12 to the top of the encapsulating material 25 of approximately 0.375 mm (15 mils). The UTOP 10' may be affixed to a substrate in the same manner as described above with respect to FIG. 3 using conventional surface mounting techniques.

Figure 6:
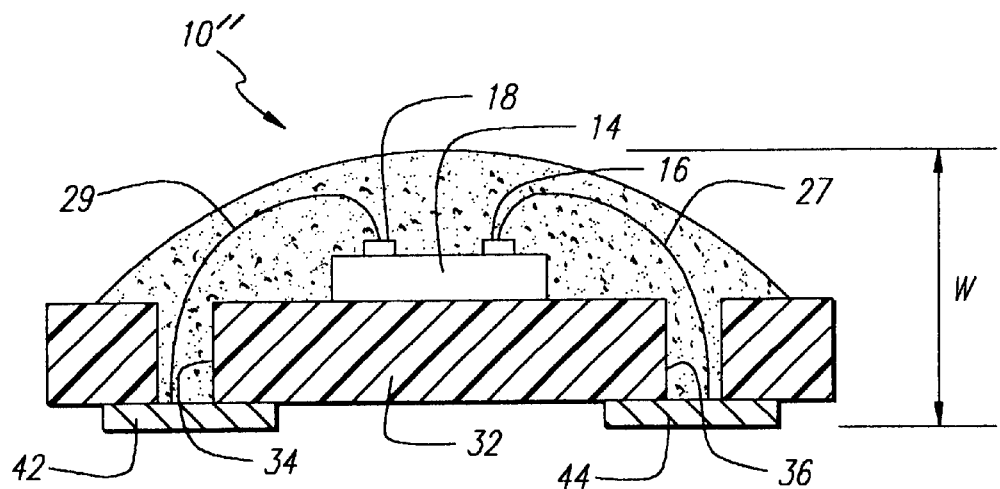
FIG. 6 is a cross-sectional side view of a UTOP constructed in accordance with a third embodiment of the present invention.
Figure 7:
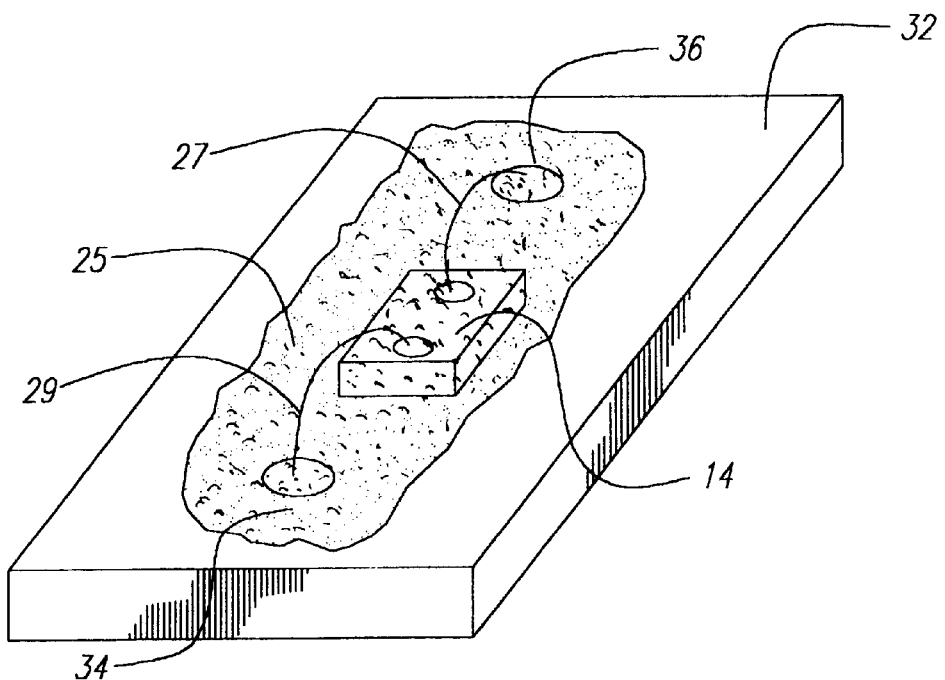
FIG. 7 is an isometric view of the UTOP of FIG. 6.

FIGS. 6 and 7 illustrate a UTOP package 10" constructed in accordance with a third embodiment of the present invention. The UTOP 10" includes a substrate 32 comprised of a flexible organic material, such as polyester, polyimide or other like materials, and having holes 34, 36 formed therein. The lower surface of the substrate 32 is laminated with conductive material and selectively patterned to provide electrical traces 42, 44 that at least partially block the holes 34, 36. The electrical traces 42, 44 are electrically isolated from one another, and may further be plated with electroless nickel/gold to protect the traces from oxidation and to allow wire bonding or soldering thereto, as described above. An integrated circuit chip 14 is attached to the substrate 32. The integrated circuit chip 14 includes conductive pads 16, 18 that are coupled to respective ones of the electrical traces 42, 44 using wire bonds 27, 29, respectively, that extend into the holes 34, 36. Thereafter, the integrated circuit chip 14, wire bonds 27, 29 and holes 34, 36 are encapsulated by an encapsulating material 25, such as epoxy. Since the thickness of the flexible substrate material is only about 0.075 mm (3 mils), and the integrated circuit chip may be thinned down to a thickness of about 0.212 mm (8.5 mils) the overall profile of the UTOP 10" may be as little as 0.287 mm (11.5 mils). The UTOP 10" may be affixed to a substrate as described above with respect to FIG. 3 using conventional surface mounting techniques.

While presently preferred embodiments of an ultra-thin outline package for integrated circuits have been shown and described, it would be apparent to those skilled in the art that various changes or modifications are possible without departing from the inventive concept disclosed herein. It is therefore to be understood that this invention may be practiced otherwise than as specifically described herein.

What is claimed is:

1. A low-profile integrated circuit package, comprising:
   a substrate having an aperture;
   at least one conductive trace that includes upper and lower portions disposed on respective upper and lower surfaces of said substrate, said substrate further comprising at least one via electrically connecting said at least one conductive trace portions together, wherein said at least one via is disposed on at least one edge surface of said aperture;
   an integrated circuit disposed in said aperture and being operatively coupled to said upper portion of said at least one conductive trace; and
   an encapsulant provided in the aperture substantially covering said integrated circuit;
   whereby, said lower portion of said at least one conductive trace is adapted for coupling of said low-profile integrated circuit package to a secondary substrate using conventional surface mounting techniques.

2. The integrated circuit package of claim 1, further comprising at least one wire bond electrically coupling the integrated circuit to the at least one conductive trace, and wherein the encapsulant is provided over the integrated circuit and the at least one wire bond.

3. The integrated circuit package of claim 2, wherein the integrated circuit further comprises at least one bond pad coupled to the at least one wire bond.

4. The integrated circuit package of claim 1, wherein the at least one conductive trace further comprises a plurality of conductive traces electrically isolated from each other.

5. The integrated circuit package of claim 1, wherein the substrate comprises a circuit board material.

6. The integrated circuit package of claim 1, wherein the substrate comprises an organic material.

7. The integrated circuit package of claim 1, wherein the at least one conductive trace comprises a conductive metal material.

8. The integrated circuit package of claim 1, comprising a vertical profile in a range of approximately 0.3 to 0.375 mm.

9. A low-profile integrated circuit package, comprising:

a substrate having an aperture;

at least one conductive trace that includes upper and lower portions disposed on respective upper and lower surfaces of said substrate, said substrate further comprising at least one via electrically connecting said at least one conductive trace portions together, wherein said at least one via is disposed on at least one edge surface of said substrate;

an integrated circuit disposed in said aperture and being operatively coupled to said upper portion of said at least one conductive trace; and an encapsulant provided in the aperture substantially covering said integrated circuit;

whereby, said lower portion of said at least one conductive trace is adapted for coupling of said low-profile integrated circuit package to a secondary substrate using conventional surface mounting techniques.

10. The integrated circuit package of claim 9, further comprising at least one wire bond electrically coupling the integrated circuit to the at least one conductive trace, and wherein the encapsulant is provided over the integrated circuit and the at least one wire bond.

11. The integrated circuit package of claim 10, wherein the integrated circuit further comprises at least one bond pad coupled to the at least one wire bond.

12. The integrated circuit package of claim 9, wherein the at least one conductive trace further comprises a plurality of conductive traces electrically isolated from each other.

13. The integrated circuit package of claim 9, wherein the substrate comprises a circuit board material.

14. The integrated circuit package of claim 9, wherein the substrate comprises an organic material.

15. The integrated circuit package of claim 9, wherein the at least one conductive trace comprises a conductive metal material.

16. The integrated circuit package of claim 9, comprising a vertical profile in a range of approximately 0.3 to 0.375 mm.

17. A radio frequency (RF) transponder, comprising:

a low-profile integrated circuit package comprising:
   a substrate having at least one conductive trace disposed on a surface thereof;
   an integrated circuit coupled to said substrate and being operatively coupled to said at least one conductive trace; and
   an encapsulant substantially covering said integrated circuit; and a secondary substrate having an antenna disposed on a surface thereof, said low-profile integrated circuit package being surface mounted on said secondary substrate in electrical connection with said antenna;

wherein said substrate further comprises an aperture, said integrated circuit being disposed in said aperture; and wherein said at least one conductive trace further comprises upper and lower portions disposed on respective upper and lower surfaces of said substrate, said substrate further comprising at least one via electrically coupling said at least one conductive trace portions together.

18. The RF transponder of claim 17, wherein said at least one via is disposed on at least one edge surface of said aperture.

19. The RF transponder of claim 17, wherein said at least one via is disposed on at least one edge surface of said substrate.

20. A radio frequency (RF) transponder, comprising:

a low-profile integrated circuit package comprising:
   a substrate having at least one conductive trace disposed on a surface thereof;
   an integrated circuit coupled to said substrate and being operatively coupled to said at least one conductive trace; and
   an encapsulant substantially covering said integrated circuit; and a secondary substrate having an antenna disposed on a surface thereof, said low-profile integrated circuit package being surface mounted on said secondary substrate in electrical connection with said antenna;

wherein said substrate comprises at least one hole extending therethrough; and wherein said at least one conductive trace is disposed on a lower surface of said substrate at least partially blocking said at least one hole.

21. The RF transponder of claim 20, further comprising at least one wire bond electrically coupling the integrated circuit to the at least one conductive trace, and wherein the encapsulant is provided over the integrated circuit and the at least one wire bond.

22. The RF transponder of claim 21, wherein the integrated circuit further comprises at least one bond pad coupled to the at least one wire bond.

23. The RF transponder of claim 20, wherein said integrated circuit is disposed on an upper surface of said substrate and is operatively coupled to said at least one conductive trace through said at least one hole.

24. The RF transponder of claim 20, wherein the at least one conductive trace further comprises a plurality of conductive traces electrically isolated from each other.

25. The RF transponder of claim 20, wherein the substrate comprises a circuit board material.

26. The RF transponder of claim 20, wherein the substrate comprises an organic material.

27. The RF transponder of claim 20, wherein the at least one conductive trace comprises a conductive metal material.

28. The RF transponder of claim 20, wherein the integrated circuit package comprising a vertical profile above said secondary substrate of approximately 0.375 mm.

29. The RF transponder of claim 20, further comprising a radio frequency identification (RFID) transponder.

30. A low-profile integrated circuit package, comprising:

a first substrate having at least one hole extending therethrough;

at least one conductive trace disposed on a lower surface of said first substrate at least partially blocking said at least one hole;

an integrated circuit disposed on said first substrate and being operatively coupled to said at least one conductive trace through said at least one hole;

an encapsulant substantially covering said integrated circuit; and a second substrate having an antenna disposed on a surface thereof and connected with said at least one conductive trace.

31. The integrated circuit package of claim 30, further comprising at least one wire bond, and wherein said at least one wire bond is directly connected to the integrated circuit and the at least one conductive trace through said at least one hole.

32. The integrated circuit package of claim 30, wherein said first substrate comprises a flexible organic material.

* * * * *